(12) United States Patent
Takahashi

(10) Patent No.: US 9,461,083 B2
(45) Date of Patent: Oct. 4, 2016

(54) SOLID-STATE IMAGE PICKUP ELEMENT AND IMAGE PICKUP APPARATUS

(71) Applicant: FUJIFILM Corporation, Tokyo (JP)

(72) Inventor: Shu Takahashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 776 days.

(21) Appl. No.: 13/852,268

(22) Filed: Mar. 28, 2013

(65) Prior Publication Data

US 2013/0222546 A1    Aug. 29, 2013

Related U.S. Application Data

(63) Continuation of application No. PCT/JP2011/061103, filed on May 13, 2011.

(30) Foreign Application Priority Data

Sep. 29, 2010   (JP) ................................ 2010-220074

(51) Int. Cl.
    H04N 13/02    (2006.01)
    H01L 27/146   (2006.01)
    H04N 5/369    (2011.01)
    H04N 5/335    (2011.01)

(52) U.S. Cl.
    CPC ... H01L 27/14629 (2013.01); H01L 27/14623 (2013.01); H01L 27/14627 (2013.01); H04N 5/335 (2013.01); H04N 5/3696 (2013.01); H04N 13/0203 (2013.01); H01L 27/14605 (2013.01); H01L 27/14645 (2013.01)

(58) Field of Classification Search
    CPC .................. H01L 27/14629; H01L 27/14605; H01L 27/14623; H01L 27/14627; H01L 27/14645; H04N 5/3696; H04N 5/335; H04N 13/0203

See application file for complete search history.

(56) References Cited

U.S. PATENT DOCUMENTS

| 2003/0063210 A1* | 4/2003 | Tsuboi | H01L 27/14621 348/340 |
| 2007/0262405 A1* | 11/2007 | Furuyama | B82Y 20/00 257/432 |
| 2009/0237801 A1* | 9/2009 | Liu | G02B 3/0062 359/622 |
| 2010/0165081 A1* | 7/2010 | Jung | H04N 13/0022 348/46 |
| 2010/0214452 A1* | 8/2010 | Kawarada | G02B 7/346 348/255 |
| 2011/0109818 A1* | 5/2011 | Uneda | G02F 1/133526 349/5 |

FOREIGN PATENT DOCUMENTS

| JP | 8330555 A | 12/1996 |
| JP | 2002314062 A | 10/2002 |
| JP | 20037994 A | 1/2003 |
| JP | 2007127746 A | 5/2007 |
| JP | 2007158109 A | 6/2007 |
| JP | 2008270679 A | 11/2008 |
| JP | 200987983 A | 4/2009 |

* cited by examiner

*Primary Examiner* — Tat Chio
(74) *Attorney, Agent, or Firm* — Sughrue Mion, PLLC

(57) ABSTRACT

A plurality of pixels PD1, PD2 for detecting the phase difference are treated as a pixel group, and a slit 46, which makes incident light entering into each of the pixels of the pixel group PD1, PD2 asymmetrical, is formed in between optical elements (microlenses) 43 formed at an upper layer at the light-entering side of the pixel group PD1, PD2, and in between intermediate refractive-index layers 45. The side faces of the slit 46 are made to be light reflecting faces.

19 Claims, 22 Drawing Sheets

SOLID-STATE IMAGE PICKUP ELEMENT AND IMAGE PICKUP APPARATUS

CROSS REFERENCE TO RELATED APPLICATION

This is a continuation of International Application No. PCT/JP2011/061103 filed on May 13, 2011, and claims priority from Japanese Patent Application No. 2010-220074 filed Sep. 29, 2010, the entire disclosures of which are incorporated herein by reference.

TECHNICAL FIELD

The present invention relates to a solid-state image pickup element on which phase difference pixels are formed, and an image pickup apparatus equipped with the solid-state image pickup element.

BACKGROUND ART

Phase difference pixels of a phase difference method (pupil division method) may be formed on an image sensor such as, for example, a CCD type or a CMOS type image sensor (solid-state image pickup element) such that the distance to a subject can be measured using the detected signal of the phase difference pixels. As a result, a high speed auto-focus can be achieved. Further, it becomes also possible to produce a stereoscopic image of the subject based on a subject image captured with the phase difference pixels.

As for a phase difference pixel which performs the pupil division of the phase difference method, phase difference pixels described in, for example, Patent Literatures 1 and 2 are known. The phase difference pixel of Patent Literature 1 is configured such that one microlens is provided for a plurality of adjacent pixels. The phase difference pixel of Patent Literature 2 is configured such that a portion of each microlens provided for each pixel is covered by a light shielding film. In some cases, a phase difference pixel may be formed by reducing an opening of a light shielding film of each pixel to be eccentric rather than providing a microlens.

CITATION LIST

Patent Literature

Patent Literature 1 JP-A-2007-158109
Patent Literature 2 JP-A-2003-7994

SUMMARY

Technical Problem

In the conventional phase difference pixel, one microlens is shared by a plurality of pixels, or a portion of a microlens of each pixel is shielded from light or an opening of light shielding film is narrowed to be eccentric.

In a case of the phase difference pixel in which a single microlens is shared by a plurality of pixels, it is required to increase a curvature of the microlens to become a flat microlens. On this account, there is a problem to be solved that such a phase difference pixel has a low detection capability of phase difference information.

In a case of the phase difference pixel in which a portion of a microlens of each pixel is shielded from light or an opening of light shielding film is narrowed to be eccentric, it becomes possible to obtain a high accuracy phase difference information as the opening of the light shielding film becomes narrower to be eccentric. However, since an amount of light transmitting through the microlens or the opening of light shielding film is reduced, there is a problem to be solved that light utilization efficiency, that is, sensitivity of the phase difference pixel is reduced.

An object of the present invention is to provide a solid-state image pickup element provided with a phase difference pixel having a high detection capability of phase difference information as well as a high light utilization efficiency, and an image pickup apparatus provided with the solid-state image pickup element.

Solution to Problem

A solid-state image pickup element of the present invention includes: a pixel group configured by a plurality of pixels detecting a phase difference; an optical element installed at an upper layer at the light-entering side of the pixel group; and a groove formed on the optical element, in which the groove makes incident light entering each of the pixels of the pixel group asymmetrical and the side surface thereof is made to be light reflecting surface.

An image pickup apparatus of the present invention includes: the solid-state image pickup element as described above; a photographing lens that focuses on a subject; and a control unit that measures a distance from each pixel of the pixel group of the solid-state image pickup element to the subject to perform a focus control of the photographing lens.

An image pickup apparatus of the present invention includes the solid-state image pickup element as described above, and a signal processing unit which receives a captured image signal detected by each pixel of the pixel group to produce a three dimensional image of a subject.

Advantageous Effects of Invention

According to the present invention, since it is configured that light reflected from side surfaces of a groove is incident on a phase difference pixel to obtain information of light which is in asymmetrical, the phase difference information can be detected without sacrificing sensitivity.

DESCRIPTION OF EMBODIMENTS

Hereinafter, embodiments of the present invention will be described with reference to the drawings.

Figure 1:
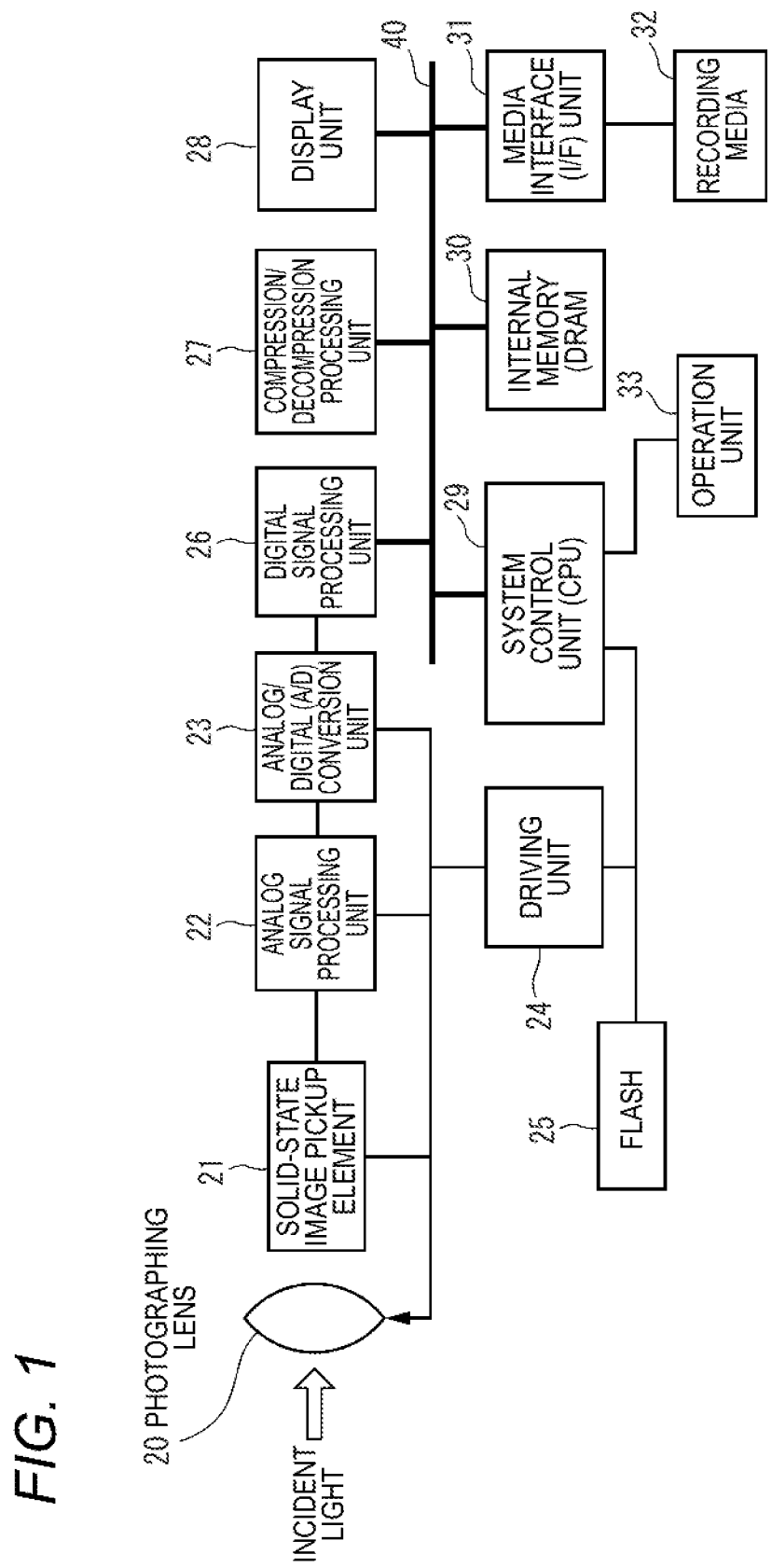
FIG. 1 is a functional block diagram illustrating a configuration of an image pickup apparatus according to one embodiment of the present invention.

FIG. 1 is a functional block diagram illustrating a configuration of an image pickup apparatus according to one embodiment of the present invention. A digital camera 10 which photographs a still image or moving image of a subject is exemplified as the image pickup apparatus of the present embodiment. The digital camera 10 includes a photographing lens 20, a solid-state image pickup element 21, an analog signal processing unit 22, an analog/digital (A/D) conversion unit 23, a driving unit 24, and a flash 25. The solid-state image pickup element 21 is placed at rear-side of the photographing lens 20 to be disposed on imaging plane thereof. The analog signal processing unit 22 performs an analog processing such as an automatic gain control (AGC) or a correlated double sampling on an analog image data output from the solid-state image pickup element 21. The analog/digital (A/D) conversion unit 23 converts the analog image data output from the analog signal processing unit 22 into a digital image data. The driving unit 24 controls the A/D conversion unit 23, the analog signal processing unit 22, the solid-state image pickup element 21 and the photographing lens 20 according to commands from the system control unit (CPU) 29 which will be described later. The driving unit 24 includes a timing generator. The flash 25 emits light according to commands from the CPU 29.

The digital camera 10 of the present embodiment further includes a digital signal processing unit 26, a compression/decompression processing unit 27, a display unit 28, a system control unit (CPU) 29, an internal memory 30 such as a frame memory, a media interface (I/F) unit 31, and a bus 40 connecting these components with each other. The digital signal processing unit 26 receives the digital image data output from the A/D conversion unit 23 and performs an interpolation processing or a white balance correction, RGB/YC conversion processing, or the like, on the received digital image data. Compression/decompression processing unit 27 that either compresses the image data in JPEG format, or the like, or decompresses the compressed image data. The display unit 28 displays, for example, a menu, or displays a through image (live view image) or a captured image. The CPU 29 comprehensively controls the entirety of the digital camera. The media interface (I/F) unit 31 provides interfacing with a recording media 32 that stores JPEG image data, or the like. Further, an operation unit 33 used for inputting commands by a user is connected to the system control unit 29.

The solid-state image pickup element 21, details of which will be described later, may be either a CCD type or a CMOS type as long as pixels are arranged to be disposed in a two dimensional array. The phase difference pixels having a configuration to be described below are installed in the solid-state image pickup element 21 as some of pixels thereof. The CPU 29 receives a detection signal of the phase difference pixel, interprets the detection signal of the phase difference pixel using the digital signal processing unit 26, and measures the distance to a subject. Also, the CPU 29 moves a focus positioning lens of the photographing lens 20 via the driving unit 24 based on the measured distance to be focused on a subject.

All the pixels of an effective pixel area of the solid-state image pickup element 21 are grouped into pairs of two pixels where each pair of two pixels forms the phase difference pixel. In such a case, a parallax occurs due to difference in a light incidence direction between one pixel of each pair and the other pixel of each pair. Phase difference is provided to allow a captured image of one pixel of each pair to become an image seen from a left-eye and a picked-up image of the other pixel of each pair to become an image seen from a right-eye, so that the CPU 29 of FIG. 1 can produce a stereoscopic image from the captured images of the left-eye and right-eye.

Figure 2:
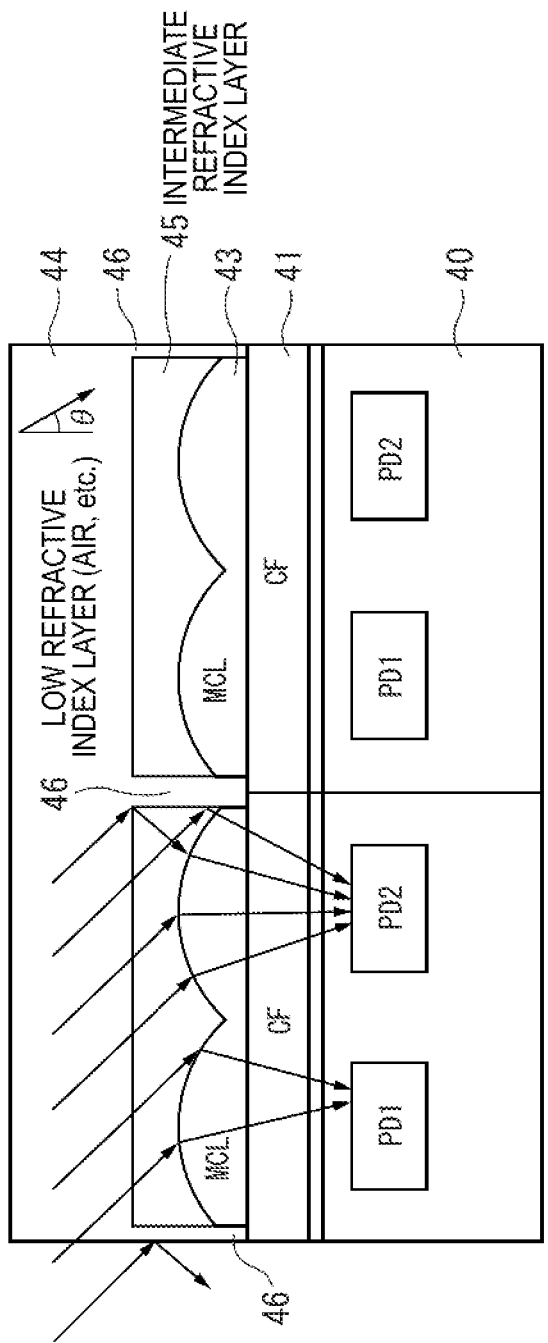
FIG. 2 is an explanatory view of a phase difference pixel according to one embodiment of the present invention.

FIG. 2 is an explanatory view of a phase difference pixel according to the first embodiment of the present invention, in which four pixels are illustrated in parallel in a horizontal direction, and a photodiode PD corresponding to each pixel is installed in a semiconductor substrate 40. Two photodiodes PD1, PD2 adjacent with each other in a horizontal direction constitute the phase difference pixels that form a pair.

A wiring layer (in a case of CMOS type) or a electric charge transfer electrode (in a case of CCD type), or a light shielding film, all of which are well-known and not illustrated, is laminated on the semiconductor substrate 40 on which two photodiodes PD1, PD2 are formed, and a color filter layer 41 is laminated thereon. Further, a microlens (MCL) 43 corresponding to each pixel is formed thereon. The microlens 43 is formed of a transparent resin layer having a refractive index n of, for example, about n=1.6.

A low refractive index layer 44, for example, air (refractive index n=1), is formed on the uppermost surface of the solid-state image pickup element 21. An intermediate refractive index layer 45 having a refractive index which is intermediate between refractive indices of both the microlens 43 and the low refractive index layer 44 is formed between the microlens 43 and the low refractive index layer 44. The refractive index n of the intermediate refractive index layers 45 is, for example, about n=1.4.

With the configuration described above, a phase difference does not occur between the light incident on the photodiode PD1 and the light incident on the photodiode PD2, and both pixels (both photodiodes PD1 and PD2) do not become the phase difference pixels.

Accordingly, in the present embodiment, a slit (groove) 46 which is parallel to an optical axis of the photographing lens 20 of FIG. 1 is formed on optical elements (the intermediate refractive index layer 45 and the microlens 43) between alternate photodiodes adjacent to each other. The slit 46 is filled with the same material as the low refractive index layer 44. Accordingly, the light entered into the intermediate refractive index layer 45 and incident on a side surface (light reflecting surface) of the slit 46 is totally reflected from the side surface to be incident on a photodiode PD (PD2 in FIG. 2) located directly therebelow.

That is, two photodiodes PD1 and PD2 that sandwich the slit 46, or two photodiodes PD1 and PD2 similar to the former two photodiodes PD1 and PD2 but sandwiched between the slits 46 become to have asymmetrical optical property and thus become the phase difference pixel.

Figure 3:
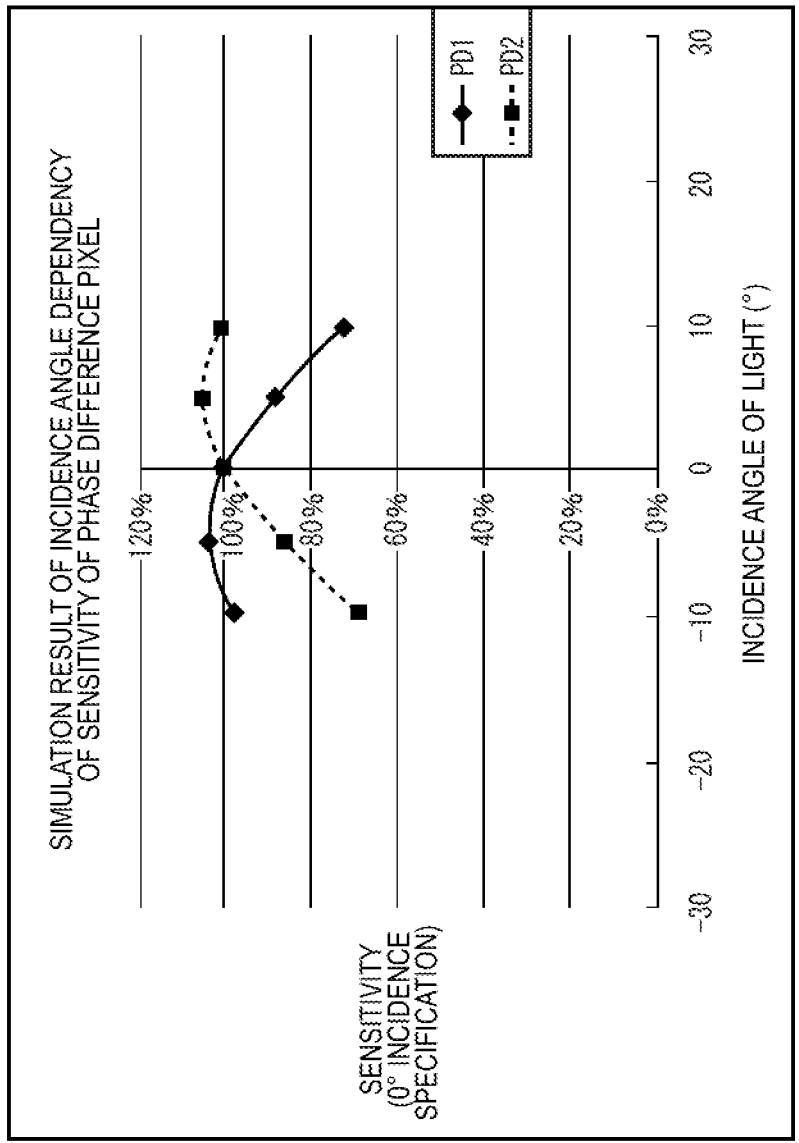
FIG. 3 is a graph illustrating a simulated result representing incidence angle dependency of sensitivity of the phase difference pixel illustrated in FIG. 2.

FIG. 3 is a graph illustrating a simulation result representing an investigated incidence angle dependency of sensitivity of two photodiodes PD1 and PD2 constituting the phase difference pixels. The incidence angle θ (see upper right portion of FIG. 2) of light is defined at an axis of abscissas and the sensitivity is defined at an axis of ordinates. According to the simulation result, it can be seen that light receiving sensitivity of two phase difference pixels PD1 and PD2 forming a pair has light incidence angle dependency.

Since a portion of the microlens is not shielded from light, the sensitivity of the phase difference pixels PD1, PD2 according to the present embodiment is not reduced. In the meantime, an incident light is desirably reflected totally from the side surfaces of the slit 46, so that the side surface is desirably formed in a mirror surface rather than in an uneven state.

Figure 4:
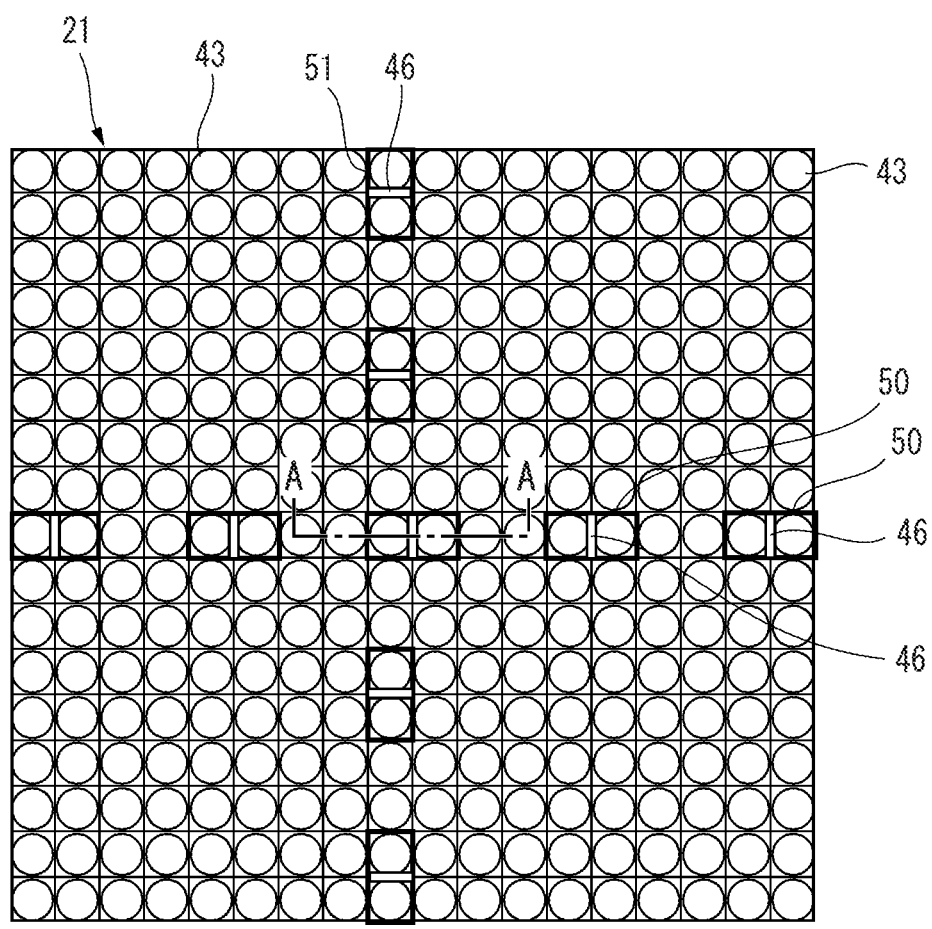
FIG. 4 is an explanatory view of the phase difference pixel of a first embodiment of the present invention.
Figure 5:
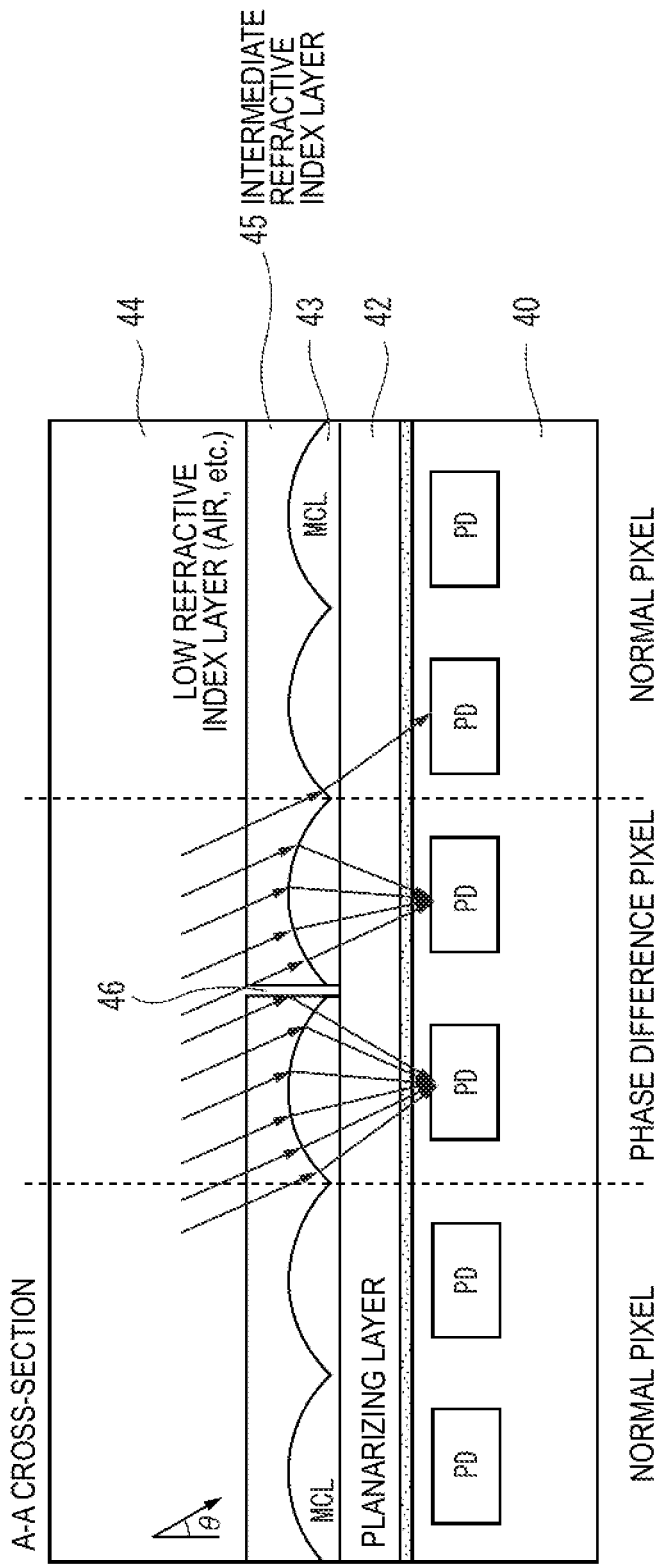
FIG. 5 is a cross sectional view taken along line A-A of FIG. 4.

FIG. 4 is a surface view of the solid-state image pickup element having the phase difference pixels forming the pair described in FIG. 2 installed on discrete positions of light receiving surface. In the FIG. 4, a microlens laminated on each pixel is denoted by ○, and a signal readout unit and the like other than the microlens are not illustrated. FIG. 5 is a cross sectional view taken along line A-A of FIG. 4. The solid-state image pickup element of the embodiment illustrated in FIG. 5 is formed with a planarizing layer 42 instead of the color filter layer 41 and thus has a configuration capable of photographing a monochrome image.

The solid-state image pickup element 21 illustrated in FIG. 4 is formed with a plurality of pixels arranged in a square lattice shape and a microlens is equipped on each of the pixels. In the present embodiment, pairs 50 of the phase difference pixels are disposed at discrete positions (two-pixel interval in an illustrated example) of a pixel row extending horizontally from a center of light receiving surface, and pixels of each pair is separated from each other by a slit 46 extending in a vertical direction.

Further, pairs 51 of the phase difference pixels are also disposed at discrete positions (two-pixel interval in the illustrated example) of a pixel column extending vertically from a center of light receiving surface, and pixels of each pair is separated from each other by a slit 46 extending in a horizontal direction.

A phase difference of a subject in a horizontal direction is detected based on the pairs 50 of the phase difference pixels in a horizontal direction. A phase difference of the subject in a vertical direction is detected based on the pairs 51 of the phase difference pixels in a vertical direction. That is, the respective pairs of the phase difference pixels are stereoscopic binocular phase difference detection pixels.

Figure 6:
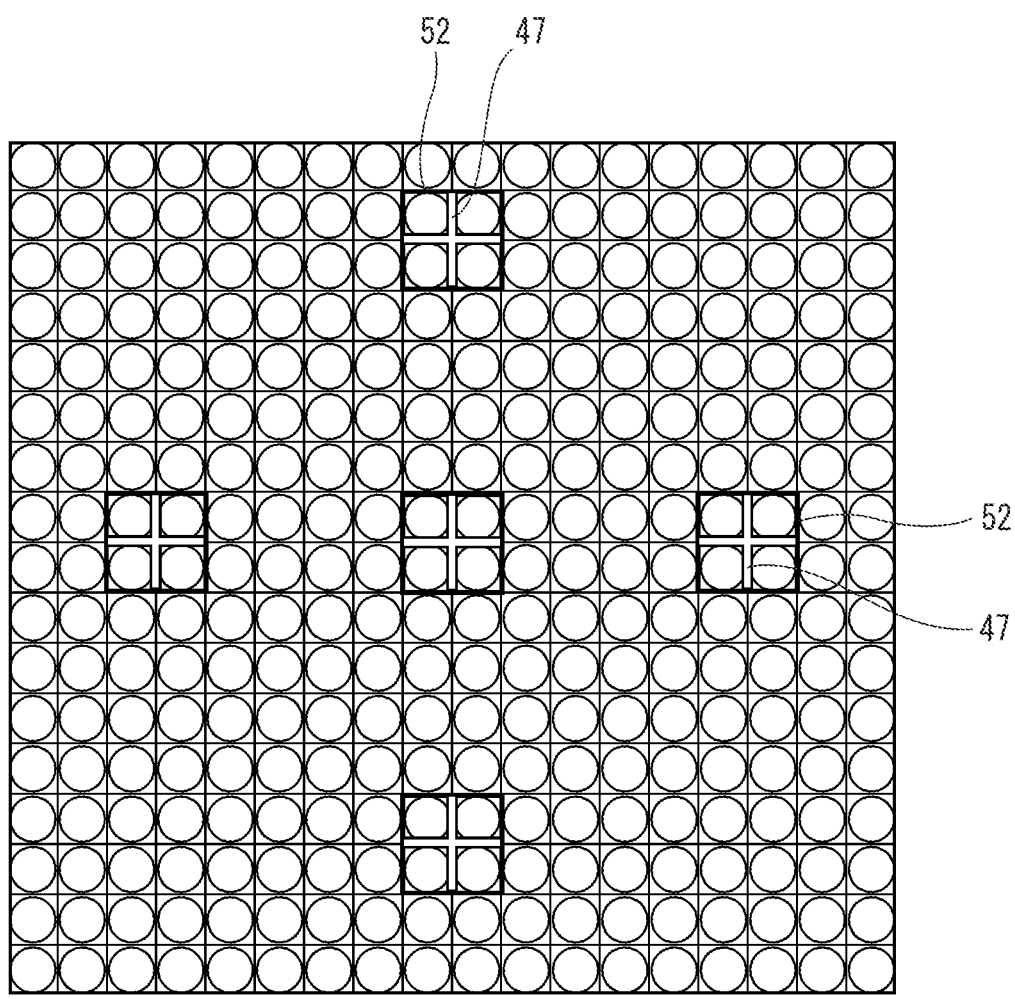
FIG. 6 is an explanatory view of a phase difference pixel of a second embodiment of the present invention.

FIG. 6 is an explanatory view of the phase difference pixel according to a second embodiment of the present invention. Groups 52 of the phase difference pixels are installed at discrete positions of light receiving surface, that is, in the illustrated example, at a center of light receiving surface, and at four-pixel interval positions in horizontal direction and in vertical direction thereof.

Groups 52 of the phase difference pixels are configured by forming the nearest adjoining 2×2=4 pixels as a group. The four pixels are separated by a cross shaped slit 47 when viewed from the top. In the present embodiment, the four pixels becomes a quadruple stereoscopic phase difference pixels in which the phase difference in vertical direction and a horizontal direction are detected based on a single group 52 of the phase difference pixels.

In the meantime, a rectangular shape groove surrounding the group of the pixels other than the cross shaped groove in the group of the pixels may be formed. In addition, one common microlens may be installed on the groups of the pixels having the cross shaped groove or the rectangular shape groove as similarly in the embodiment of FIG. 15 which will be described later.

Figure 7:
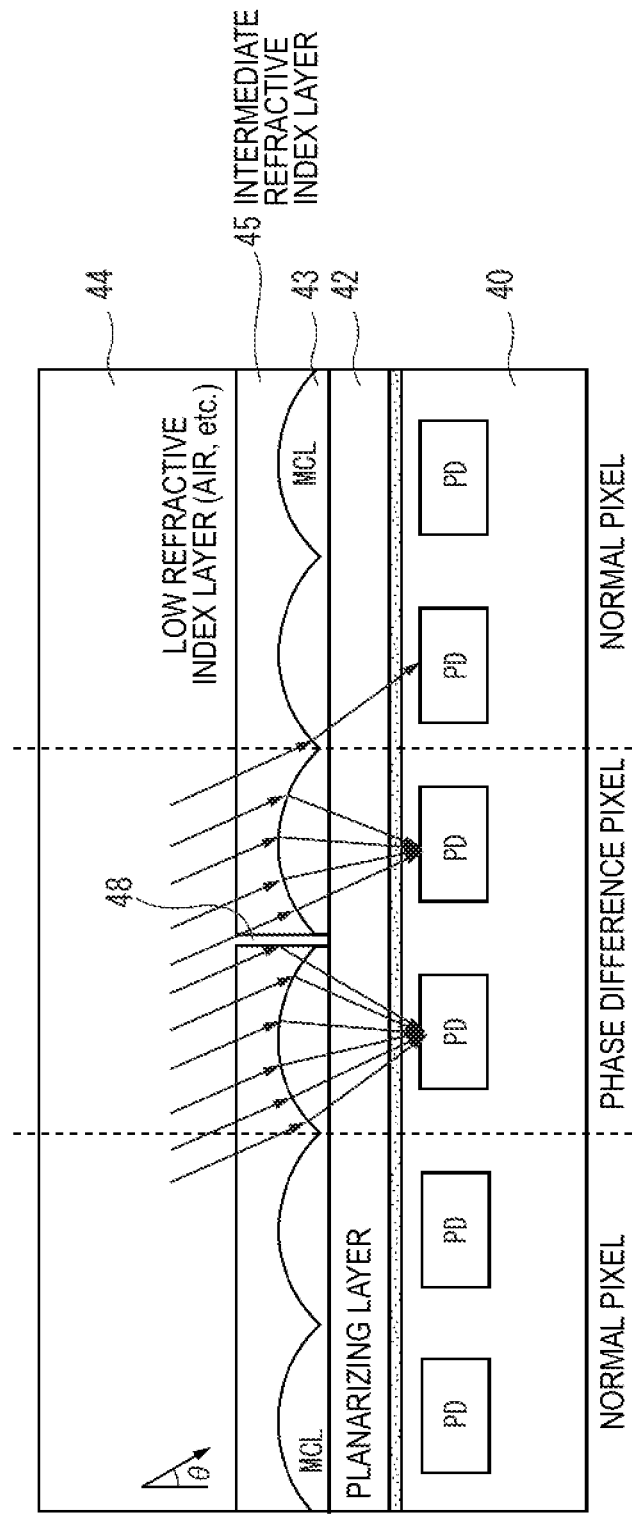
FIG. 7 is a cross sectional view of a phase difference pixel of a third embodiment of the present invention.

FIG. 7 is a cross sectional view of the phase difference pixel according to a third embodiment of the present invention. The first and second embodiments are configured such that the phase difference pixels are separated by the slits 46, 47 and material having a low refractive index is embedded in the slits. In a case where the low refractive index material is air, the slits 46, 47 form air gap portions.

In contrast, a metal plate 48 is buried in the slits 46, 47 in the present embodiment. The metal plate 48 is formed, for example, in such a manner that the slits 46, 47 are opened with an etching after the intermediate refractive-index layer 45 is laminated, and subsequently, the slits 46, 47 are filled with metals by deposition. Also, the surface of the intermediate refractive-index layer 45 may be polished with, for example, CMP to manufacture the solid-state image pickup element 21 after the metal plate 48 is embedded. The metal plate 48 may be embedded in the intermediate refractive-index layer 45 instead of the slits 46, 47.

The same effect as the first and second embodiments may also be obtained in the present embodiment, and further, the light exceeding the condition of the total reflection is transmitted through a slit in the first and second embodiments. However, if a light reflecting surface is formed with a metal plate having high light reflectivity as in the present embodiment, it becomes possible to reflect all the incident light.

In the meantime, the embodiments described above are examples applied to the solid-state image pickup element where the respective pixels are arranged in a square lattice shape. However, the embodiments may also be applied to a so-called honeycomb pixel arrangement where even numbered pixel rows are arranged to be displaced with respect to odd numbered pixel rows by ½ pixel pitch. In this case, the slits 46, 47 or the metal plate 48 becomes to have a shape obliquely slanted at 45 degrees.

Figure 8:
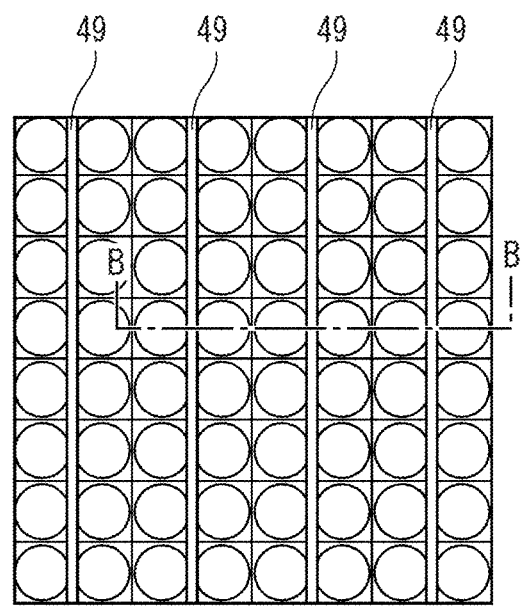
FIG. 8 is an explanatory view of the phase difference pixel of a fourth embodiment of the present invention.
Figure 9:
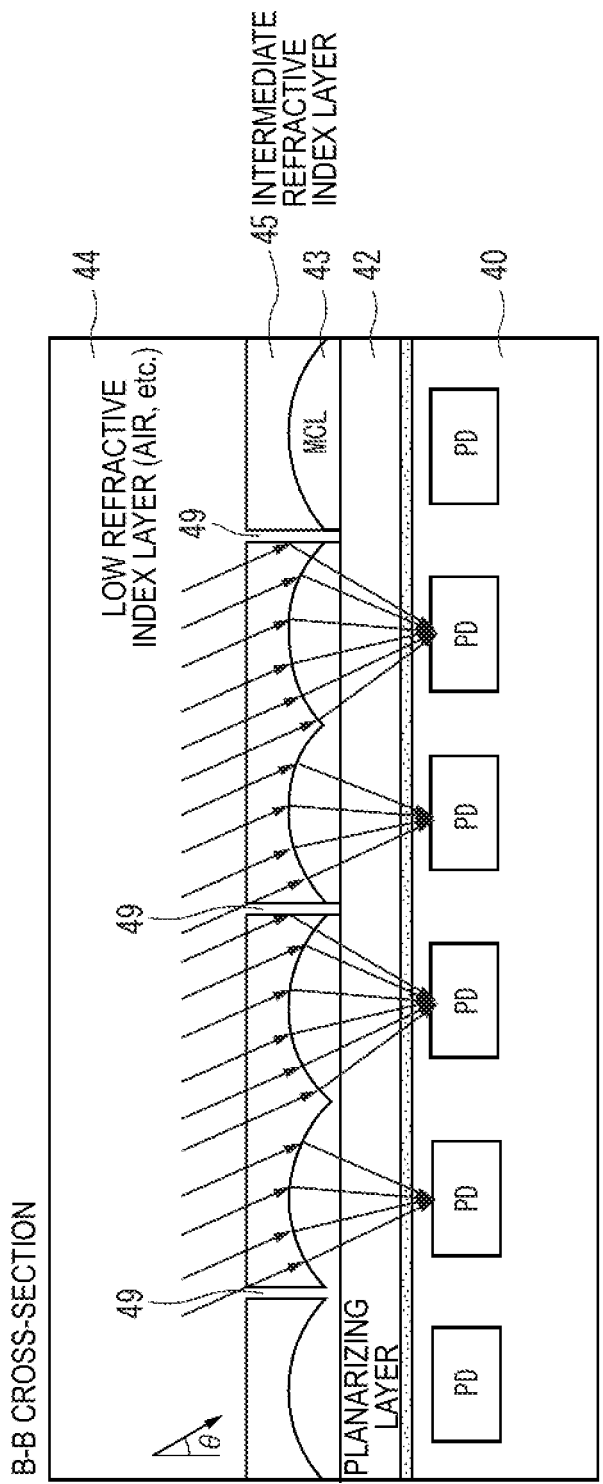
FIG. 9 is a cross sectional view taken along line B-B of FIG. 8.

FIG. 8 is an explanatory view of the phase difference pixel according to a fourth embodiment of the present invention, and FIG. 9 is a cross sectional view taken along line B-B of FIG. 8. In the present embodiment, all pixels within an effective region are the phase difference pixels. That is, every other slits 49 in vertical direction are formed over the entirety of the light receiving surface. Similar to the embodiment of FIG. 7, inside of the slit 49 may also be filled with metals in the present embodiment.

Accordingly, stereoscopic phase difference information can be obtained from all the pixels, and further, it becomes possible to obtain a stereoscopic three dimensional image with a single solid-state image pickup element 21. That is, an image of a subject viewed by a right eye can be captured with left pixels of each slit 49, and an image of a subject viewed by a left eye can be captured with right pixels of each slit 49. Though each pixel is the phase difference pixel, it is not such a configuration in which a portion of microlens is shielded from light or a configuration in which the opening of the light shielding film is narrowed to be eccentric. Therefore, it becomes possible to capture (pickup) a stereo image of the subject without reducing sensitivity. Further, all the pixels becomes possible to measure a distance to the subject.

In the embodiment exemplified in FIG. 8, when the number of pixels in a horizontal direction is set to x, the slit 49 extending vertically is formed every x=2. However, it is also possible to form the slit 49 for every x≥3. Though even in this case, the stereoscopic phase difference information in a horizontal direction can be detected. When capturing an image of the subject image, it becomes possible to perform correction of pixels using a sensitivity characteristic of a normal pixel sandwiched between the phase difference pixels.

The slits 49 may not be formed in a vertical direction (column direction) but formed in a horizontal direction (row direction). In this case, the phase difference information in longitudinal direction (vertical direction) can be obtained. Further, the direction at which the light reflective surface by the slit 49 is formed may also be inclined by 45 degrees in the solid-state image pickup element of a honeycomb pixel arrangement where the pixel arrangement is displaced by 45 degrees.

Figure 10:
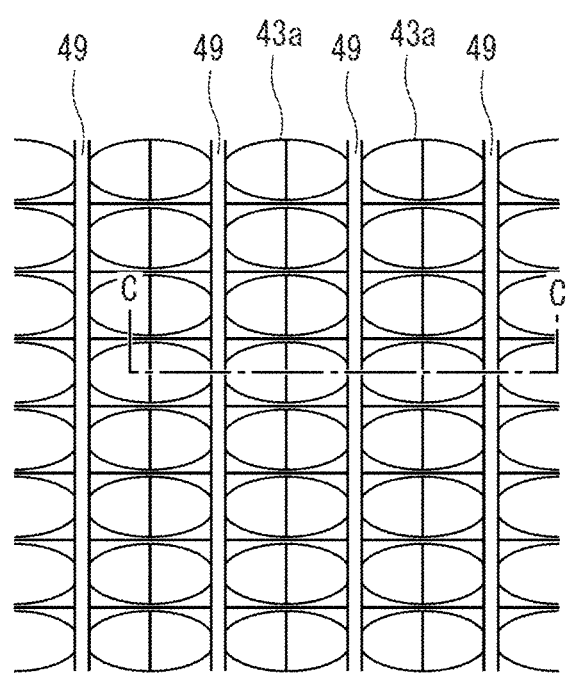
FIG. 10 is an explanatory view of a phase difference pixel of a fifth embodiment of the present invention.
Figure 11:
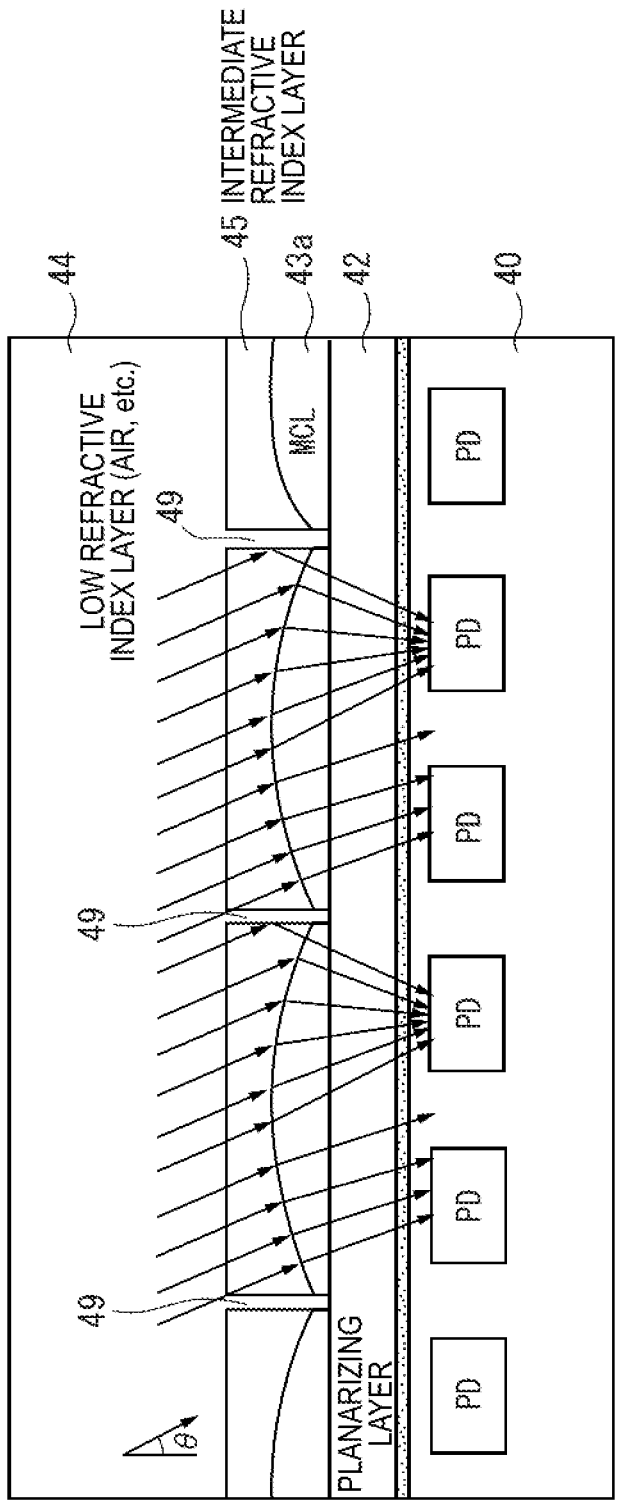
FIG. 11 is a cross sectional view taken along line C-C of FIG. 10.

FIG. 10 is an explanatory view of the phase difference pixel according to a fifth embodiment of the present invention, and FIG. 11 is a cross sectional view taken along line C-C of FIG. 10. In the embodiment of FIG. 8, each of two pixels between the adjacent slits 49 is provided with microlens. However, the present embodiment has a configuration in which two pixels between the adjoining slits 49 shares a single microlens 43a. According to the present embodiment, a single microlens is shared by two phase difference pixels such that in addition to the phase difference information caused by positional difference depending on whether light reflecting surface of the slit is located at left or right, the phase difference of light separation by the microlens is added to improve a phase difference detection capability.

Figure 12:
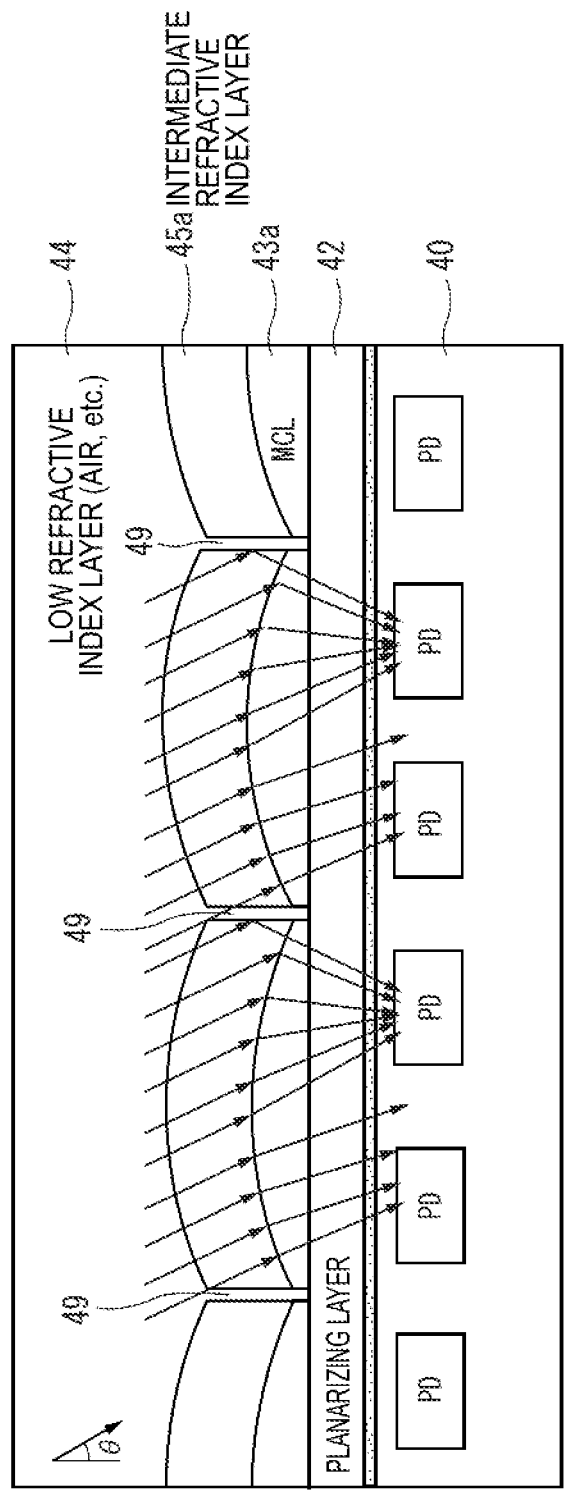
FIG. 12 is a cross sectional view of a phase difference pixel of a sixth embodiment of the present invention.

FIG. 12 is a cross sectional view of the phase difference pixel according to a sixth embodiment of the present invention. It is assumed that the arrangement of pixels when viewed from above is identical with that of FIG. 10. The surface of the intermediate refractive-index layer 45 is formed in a plane in the embodiment illustrated in FIG. 11. However, the present embodiment is different from that of FIG. 11 in that the thickness of the intermediate refractive-index layer 45 is uniform to have a shape of a curved plane in conformity of the surface of the microlens 43a. According to the present embodiment, an effect of light separation by a lens effect of the surface of the intermediate refractive-index layer 45 is added to further improve the phase difference detection capability.

Figure 13:
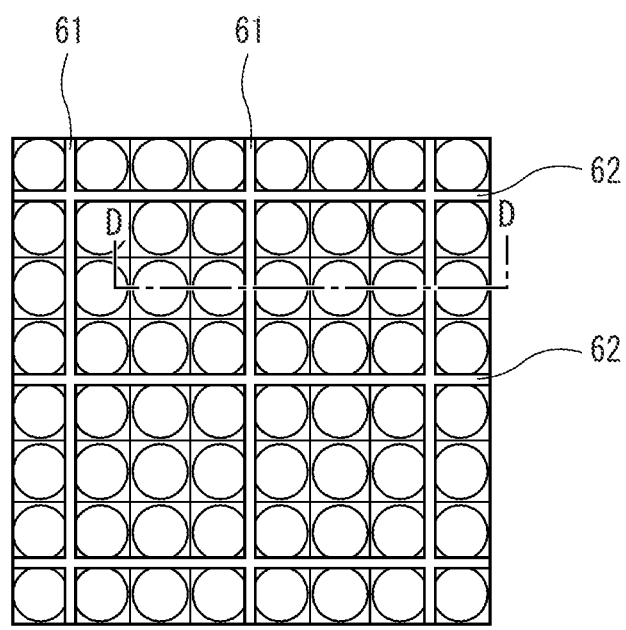
FIG. 13 is an explanatory view of a phase difference pixel of a seventh embodiment of the present invention.
Figure 14:
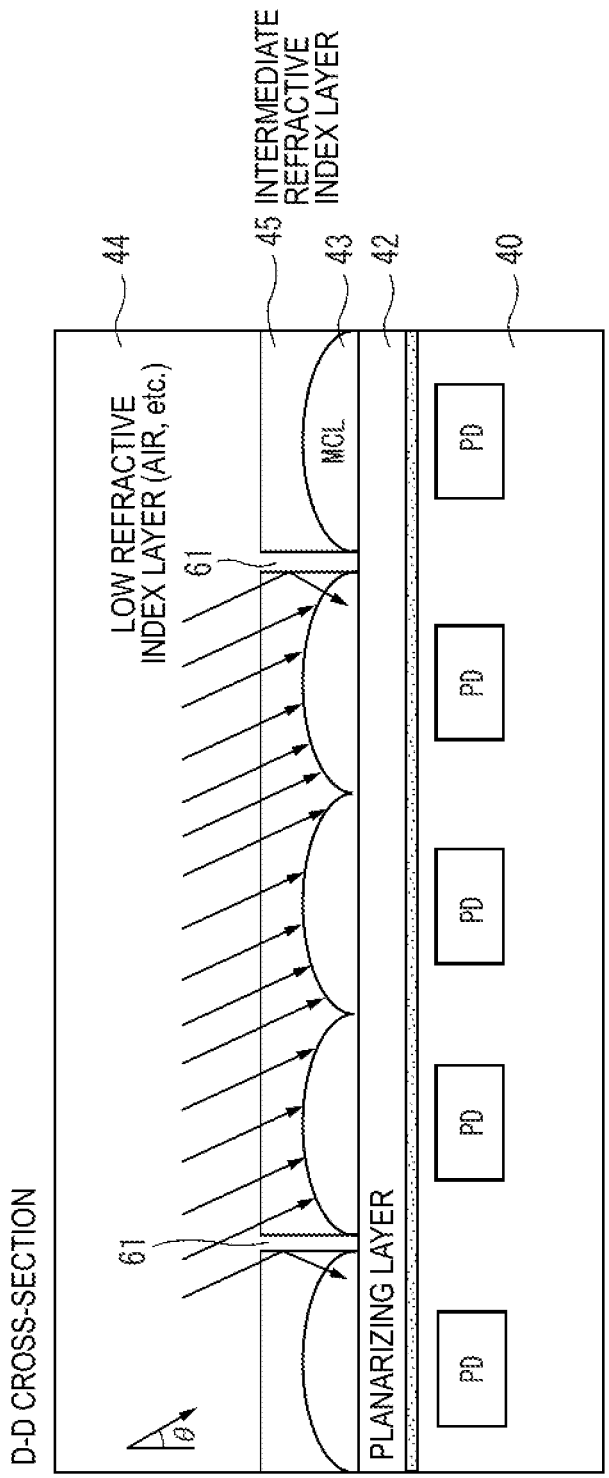
FIG. 14 is a cross sectional view taken along line D-D of FIG. 13.

FIG. 13 is an explanatory view of the phase difference pixel according to a seventh embodiment of the present invention, and FIG. 14 is a cross sectional view taken along line D-D of FIG. 13. In the present embodiment, the nearest adjacent nine pixels of 3×3 pixels forms a single group, and a slit 61 extending vertically is formed every three pixels in the horizontal direction and a slit 62 extending horizontally is formed every three pixels in the vertical direction such that the respective groups are separated from each other in the entirety of the light receiving surface.

According to the present embodiment, each of nine pixels of each group can photograph an image of a subject having different phase difference information, so that distance measurement information to the subject can be obtained and three dimensional image of the subject can be photographed at the same time. The three dimensional image becomes a smooth rounded image as the view becomes a multi-view. In the present embodiment, 3×3 pixels forms a single group, but either 2×3 pixels or 4×3 pixels may form a single group, and normally n×m (including a case of n=m) pixels may form a single group. As the number of pixels within a single group becomes too many, the phase difference between pixels becomes smaller, so that an upper limit of the number of pixels within the single group may be about 4×4 pixels or 5×5 pixels.

Figure 15:
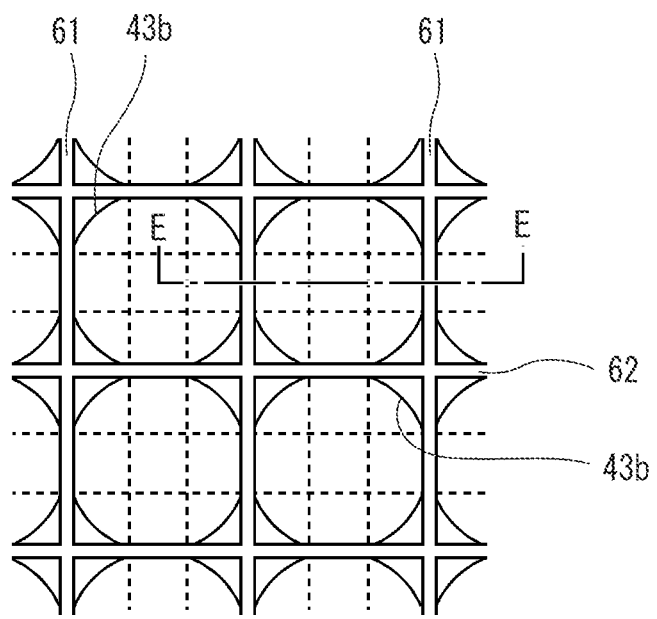
FIG. 15 is an explanatory view of a phase difference pixel of an eighth embodiment of the present invention.
Figure 16:
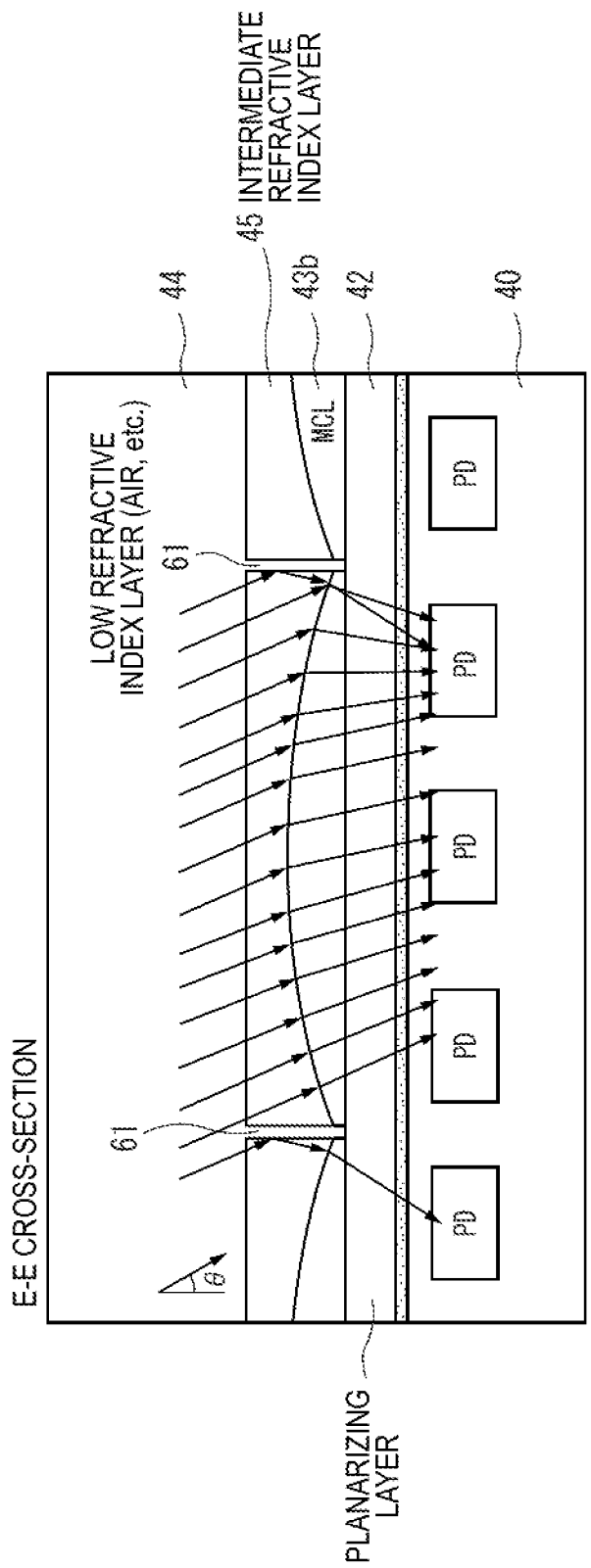
FIG. 16 is a cross sectional view taken along line E-E of FIG. 15.

FIG. 15 is an explanatory view of the phase difference pixel according to an eighth embodiment of the present invention. FIG. 16 is a cross sectional view taken along line E-E of FIG. 15. In the embodiment of FIG. 13, each pixel of nine pixels of a single group has a microlens 43. However, the present embodiment has configuration such that nine pixels of a single group share a single flat microlens 43b.

As in the present embodiment, nine pixels of each group share a single microlens 43b and thus, the phase difference due to the positional relationship of the nine pixels of light reflecting surface by the slits 61, 62 as well as the phase difference by light separation can be detected to further improve the phase difference detection capability. In the embodiment of FIG. 15, the phase difference of each of eight pixels around the center pixel can be obtained on the basis of the detection signal of the center pixel of the nine pixels.

Figure 17:
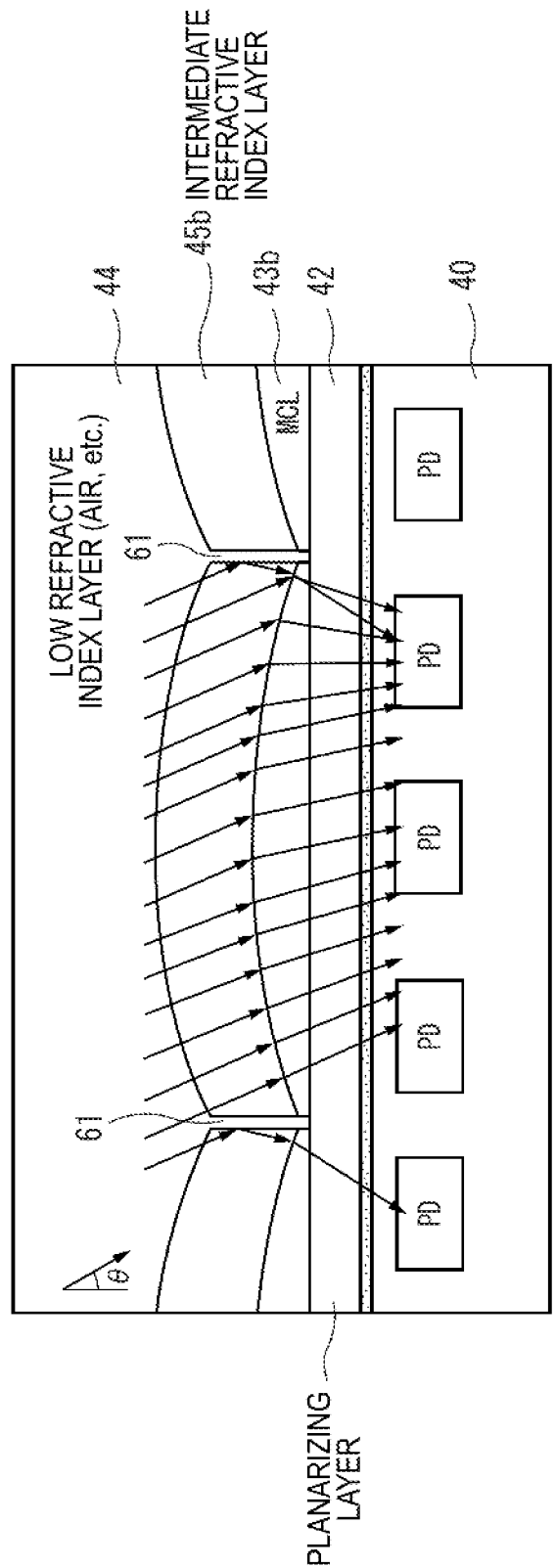
FIG. 17 is an explanatory view of a phase difference pixel of a ninth embodiment of the present invention.

FIG. 17 is an explanatory view of the phase difference pixel according to a ninth embodiment of the present invention. The present embodiment is, similar to the embodiment of FIG. 12, is different from that of FIG. 15 in that a shape of an intermediate refractive-index layer 45b is formed in a circular shape to conform to the surface of the microlens 43b.

According to the present embodiment, a light separation effect by the lens effect of the intermediate refractive-index layer 45b is added to further improve the phase difference detection capability.

Figure 18:
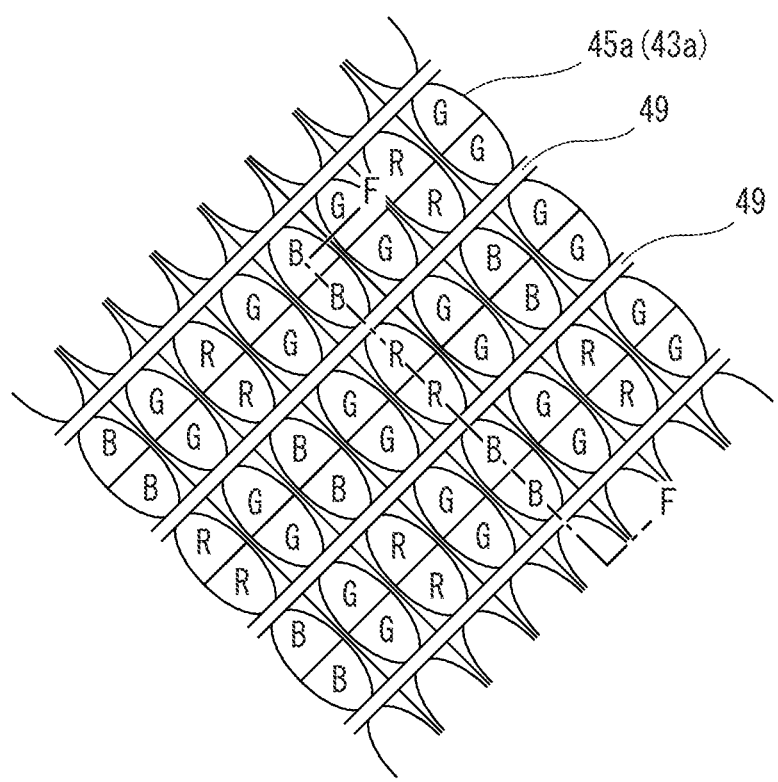
FIG. 18 is an explanatory view of a phase difference pixel of a tenth embodiment of the present invention.
Figure 19:
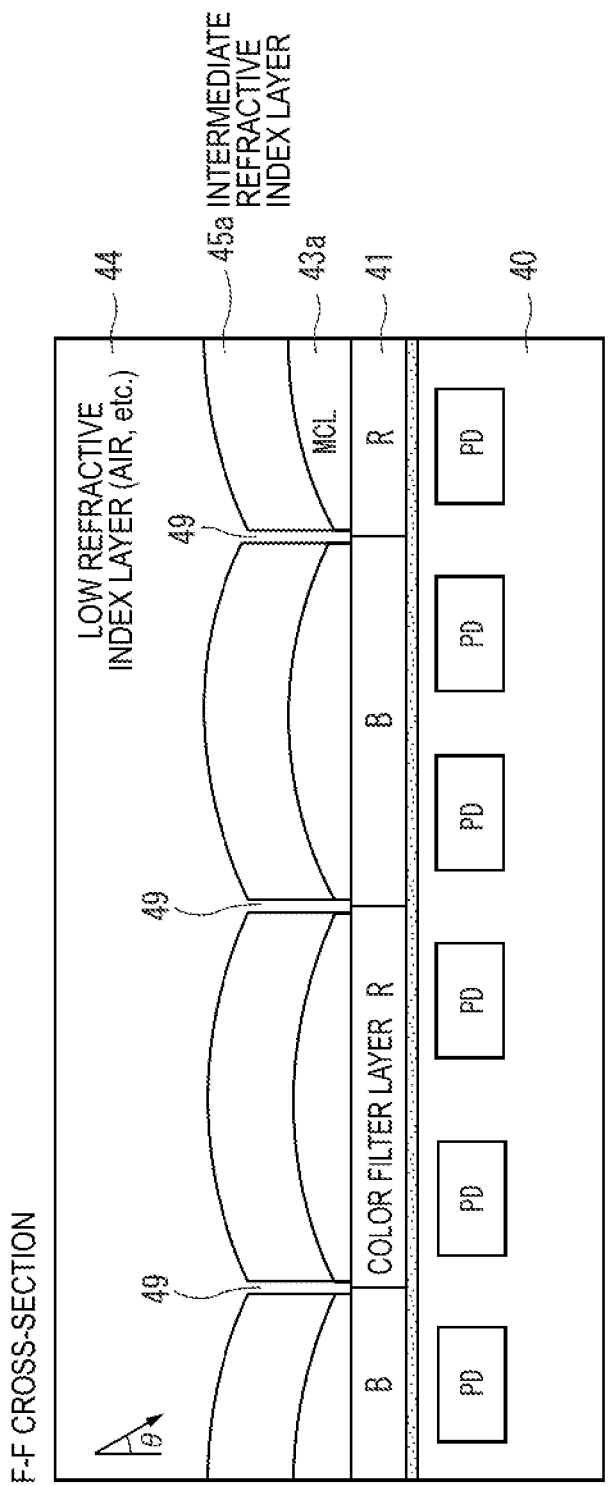
FIG. 19 is a cross sectional view taken along line F-F of FIG. 18.

FIG. 18 is an explanatory view of the phase difference pixel according to a tenth embodiment of the present invention. FIG. 19 is a cross sectional view taken along line F-F of FIG. 18. The basic structure of the cross section is the same as that of the embodiment of FIG. 12. However, the present embodiment is different from that of FIG. 12 in that the color filter layer 41 is installed instead of the planarizing layer 42 of the embodiment of FIG. 12.

The solid-state image pickup element of the present embodiment is not a square lattice arrangement in which a plurality of pixels are arranged in a two dimensional array, but a honeycomb arrangement. That is, the even-numbered pixel rows is formed to be displaced with respect to the odd-numbered pixel rows by ½ pixel pitch. As a result, a slit 49 formed to be spaced apart by two pixels is formed to be extended in an oblique direction.

When viewing only the odd-numbered pixel rows, each pixel is arranged in a square lattice, and the color filters of the three major colors of RGB is disposed on each pixel. Also, When viewing only the even-numbered pixel rows, each pixel is arranged in a square lattice, and the color filters of the three major colors of RGB is disposed on each pixel.

Accordingly, the pixels adjacent to each other obliquely have the same color filters. The obliquely arranged pixel rows having G (green) filter are formed in every other pixel row. In the remaining obliquely arranged pixel rows, an obliquely arranged pixel row in which two pixels each having R (red) filter are successively formed, and subsequently, two pixels each having B (blue) filter are successively formed and two pixels each having R (red) filter are successively formed, and, in contrast to this, another obliquely arranged pixel row in which two pixels each having B (blue) filter are successively formed, and subsequently, two pixels each having R (red) filter are successively formed and two pixels each having B (red) filter are successively formed, are alternately arranged in parallel to sandwich an obliquely arranged pixel row having G color filter.

In such a color filter arrangement formed in a dual Bayer array, a single microlens 43a is provided on two pixels having the same color and formed obliquely and successively. The phase difference pixels are inserted into the two pixels having the same color, so that the phase difference pixels do not need to be arranged in a particular color filter arrangement. Further, the Bayer array is formed dually, so that it becomes possible to capture an image of a high sensitive three dimensional subject by adding the same color pixels of two pixels and an image of a three dimensional subject having a wide dynamic range by changing an exposure time of each of two pixels.

In the meantime, when two pixels obliquely adjacent to each other are set to a unit of pixel, it may be configured such that a column in which the R color filter and the B color filter are alternately equipped and another column in which the B color filter and the R color filter are alternately equipped are alternately formed, as the color filter arrangement equipped on the unit of pixel in the odd-numbered column, and only G color filters are equipped on the unit of pixel in the even-numbered column. Such a color filter arrangement is so-called a honeycomb color filter arrangement.

Figure 20:
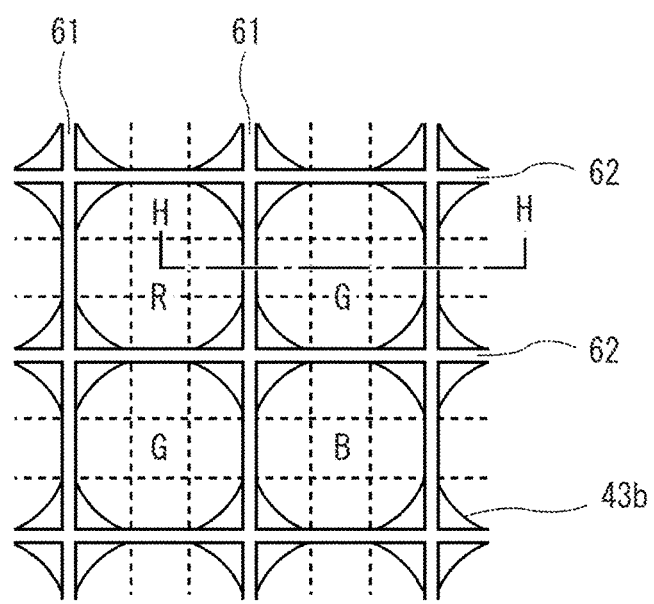
FIG. 20 is an explanatory view of a phase difference pixel of an eleventh embodiment of the present invention.
Figure 21:
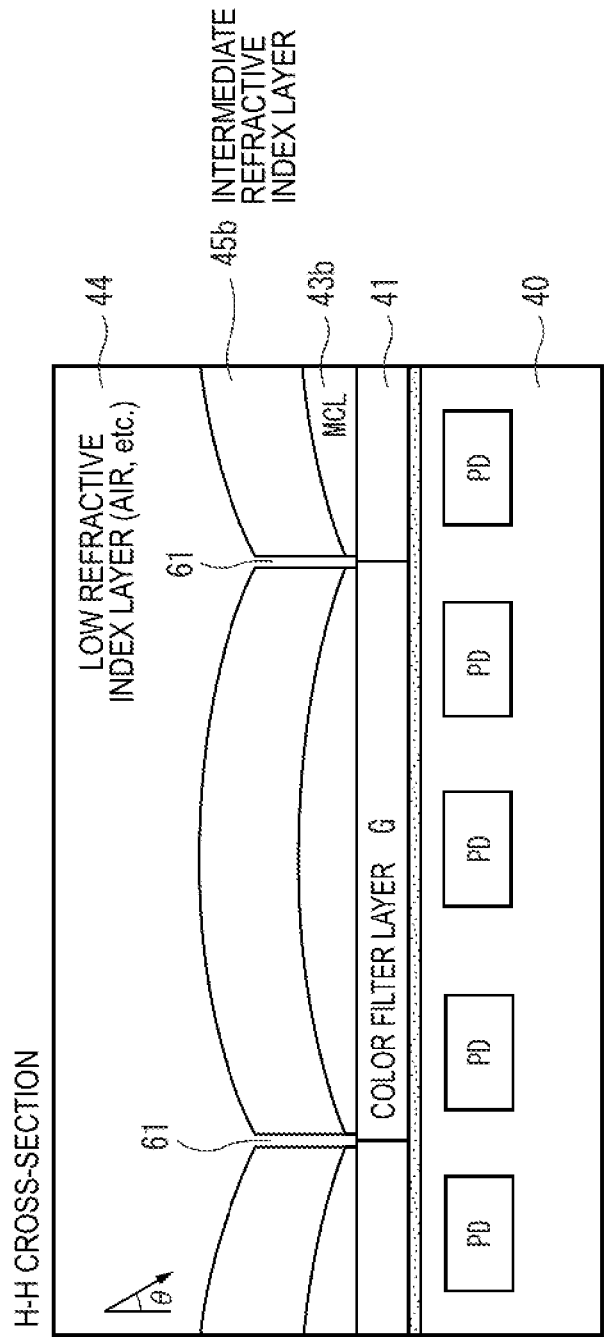
FIG. 21 is a cross sectional view taken along line H-H of FIG. 20.

FIG. 20 is an explanatory view of the phase difference pixel according to an eleventh embodiment of the present invention, and FIG. 21 is a cross sectional view taken along line H-H of FIG. 20. The present embodiment is a solid-state image pickup element, similar to the embodiment of FIG. 15, in which the nearest adjacent nine pixels of 3×3 pixels form a single group to form the slits 61, 62. In the embodiment, each group is formed in a square array, and in which the color filters having the same color are provided on the same group and the color filters of RGB are provided on each group to be arranged in a Bayer array. Also, a single microlens 43b is laminated on each group and the intermediate refractive-index layer 45b is laminated on the microlens 43b in a lens shape.

Also in the present embodiment, all the pixels are formed in multiple stereoscopic phase difference pixels, so that the distance to the subject can be measured and a three dimensional subject image can be captured. In the meantime, the color filter arrangement of each group is not limited to the Bayer array, and may be a stripe arrangement.

Figure 22:
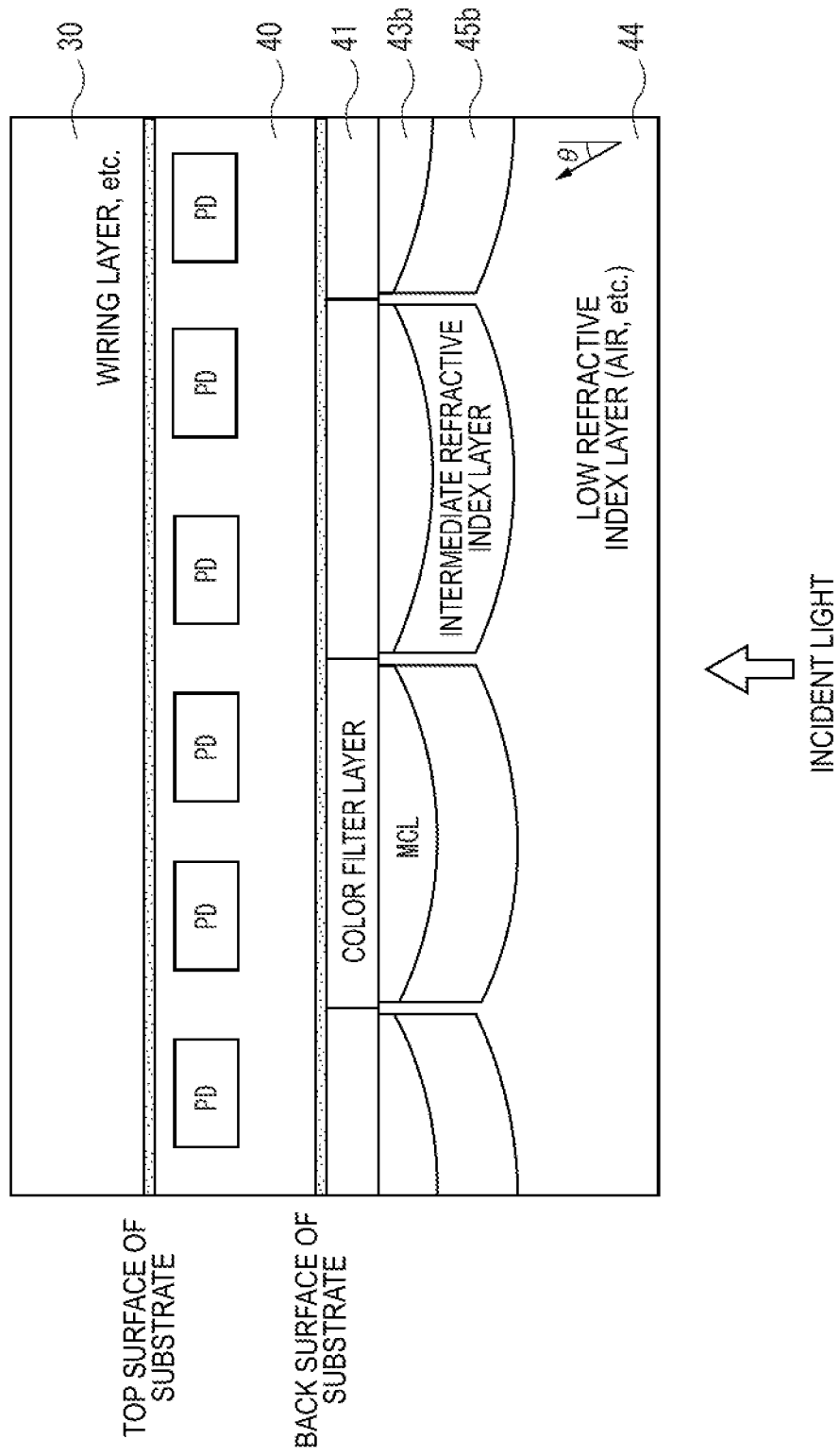
FIG. 22 is a cross sectional view of a phase difference pixel of a twelfth embodiment of the present invention.

FIG. 22 is a cross sectional view of the phase difference pixel according to a twelfth embodiment of the present invention. The solid-state image pickup elements of the first to eleventh embodiments are surface-irradiated type solid-state image pickup elements, and have a structure in which the photodiode PD and the signal read-out circuit are formed at the top surface of the semiconductor substrate, and the microlens and the like are laminated on an upper layer of the top surface. With this structure, the signal read-out circuit and the like are to be formed on the top surface, so that the opening ratio is reduced.

Therefore, it is configured that the photodiode PD and a signal read-out circuit are formed at the top surface of the semiconductor substrate and the microlens and the like are formed at a back surface of the semiconductor substrate and thus, an incident light from the subject is received on the back surface of the semiconductor substrate and the signal electric charge according to an amount of light infiltrated into the semiconductor substrate is detected by the photodiode PD disposed on the top surface. According to the rear surface irradiated solid-state image pickup element having such a configuration, the opening rate can be increased.

FIG. 22 illustrates an embodiment in which the embodiment of FIG. 19 is applied to the back surface irradiated solid-state image pickup element. A wiring layer 30 of the signal read-out circuit is formed at the top surface of the semiconductor substrate 40, and the microlens 43a or the intermediate refractive-index layer 45a on which the slit 49 is formed at the back surface thereof. As such, the respective embodiment described above of the present invention can be applied to the back surface irradiated solid-state image pickup element.

In the meantime, in the embodiments described above, a microlens or an intermediate refractive-index layer of which surface is formed in a curved surface is formed directly above the photodiode thereof. However, as described in Japanese Patent Laid-Open Publication No. 2009-87983, a countermeasure against shading may be implemented by performing a scaling in which the microlens and the like are displaced to a central direction of the light receiving surface to be obliquely directed to the incident light in consideration of the fact that the incident light becomes an oblique incident light as being closer to a peripheral portion of the light receiving surface of the solid-state image pickup element. In each of the embodiments described above, a scaling in which the microlens or the intermediate refractive-index layer on which the slit 49 and the like are formed becomes displaced to the central direction of the light receiving surface as being closer to a peripheral portion of the light receiving surface, may be performed.

In the meantime, in the embodiments described above, the respective embodiments are described individually, plural embodiments can also be combined to be implemented.

The present description discloses the following matters.

(1) A solid-state image pickup element including: a pixel group configured by a plurality of pixels detecting a phase difference; an optical element formed at an upper layer of a light-entering side of the pixel group; and a groove formed in the optical element; in which the groove makes incident light entering into each of the plurality of pixels of the pixel group asymmetrical, and a side surface of the groove is a light reflecting surface.

(2) The solid-state image pickup element according to (1), in which the pixel group is configured by two adjacent pixels, the optical element includes two microlenses each of which formed at an upper layer at a light entering side of the two adjacent pixels and corresponds to each of the two pixels, and the groove separates the two microlenses from each other.

(3) The solid-state image pickup element according to (1), in which the pixel group is configured by nearest four adjacent pixels, the optical element includes four microlenses each of which formed at an upper layer at a light entering side of the four adjacent pixels and corresponds to each of the four pixels, and the groove is formed at a cross shape when viewed from top to separate the four microlenses from each other.

(4) The solid-state image pickup element according to (1), in which the optical element is formed at the upper layer at a light entering side of the plurality of pixels of the pixel group, and the groove is formed to surround an outer periphery of the optical element.

(5) The solid-state image pickup element according to any one of (2) to (4), further including: an intermediate refractive-index layer formed at the upper layer at the light entering side of the microlens and having a refractive-index lower than that of the microlens, and a low refractive-index layer formed at an upper layer at the light entering side of the intermediate refractive-index layer and having a refractive-index lower than that of the intermediate refractive-index layer, in which the groove is also formed at the intermediate refractive-index layer, and the same material as the low refractive-index layer is embedded in the groove.

(6) The solid-state image pickup element according to any one of (2) to (4), further including: an intermediate refractive-index layer formed at the upper layer at the light entering side of the microlens and having a refractive-index lower than that of the microlens, and a low refractive-index layer formed at an upper layer at the light entering side of the intermediate refractive-index layer and having a refractive-index lower than that of the intermediate refractive-index layer, in which the groove is filled with material having high light reflectivity.

(7) The solid-state image pickup element according to (2) or (3), in which the microlens on which the groove is formed becomes displaced toward a central direction of a light receiving surface as being closer from a center of the light receiving surface of the solid-state image pickup element to a periphery thereof.

(8) The solid-state image pickup element according to any one of (1) to (7), further comprising a plurality of pixel groups, in which the plurality of pixel groups are installed at discrete positions of the light receiving surface of the solid-state image pickup element.

(9) The solid-state image pickup element according to any one of (1) to (7), further including a plurality of pixel groups, in which the plurality of pixel groups are successively installed at an entirety of the light receiving surface of the solid-state image pickup element.

(10) The solid-state image pickup element according to (1), in which the optical element includes a single microlens which commonly covers the plurality of pixels of the pixel group.

(11) The solid-state image pickup element according to (4), further including a plurality of pixel groups, in which the plurality of pixel groups are successively installed at the entirety of the light receiving surface, and the optical element is shared to cover the pixels of each pixel group and has the microlens corresponding to each pixel group, the solid-state image pickup element further including: an intermediate refractive-index layer formed at an upper layer at the light entering side of the microlens and made of material having a refractive-index lower than that of the microlens; and a low refractive-index layer formed at an upper layer at the light entering side of the intermediate refractive-index layer and having a refractive-index lower than that of the intermediate refractive-index layer, in which the groove is also formed at the intermediate refractive-index layer, and the same material as the low refractive-index layer is embedded in the groove.

(12) The solid-state image pickup element according to (11), in which the surface of the intermediate refractive-index layer has a shape which is in conformity with the surface of the microlens.

(13) The solid-state image pickup element according to (4), further including a plurality of pixel groups, in which the plurality of pixel groups are successively installed at the entirety of the light receiving surface, and the optical element is shared to cover the pixels of each pixel group and has the microlens corresponding to each pixel group, the solid-state image pickup element further including: an intermediate refractive-index layer formed at an upper layer at the light entering side of the microlens and made of material having a refractive-index lower than that of the microlens; and a low refractive-index layer formed at the upper layer at the light entering side of the intermediate refractive-index layer and having a refractive-index lower than that of the intermediate refractive-index layer, in which the groove is also formed at the intermediate refractive-index layer, and the groove is filled with material having high light reflectivity.

(14) The solid-state image pickup element according to any one of (9) to (13), in which the pixel group is arranged on the light receiving surface of the solid-state image pickup element in a square lattice, each pixel of each pixel group has a color filter having the same color, and a color filter arrangement of the pixel group is arranged in a Bayer array or stripe array.

(15) The solid-state image pickup element according to any one of (9) to (13), in which a pixel group of an odd-numbered row formed on the light receiving surface of the solid-state image pickup element and a pixel group of an even-numbered row formed thereon are formed to be displaced by ½ pitch, each pixel of each pixel group has a color filter having the same color, color filters of the pixel group of odd-numbered row are arranged in a Bayer array, and color filters of the pixel group of even-numbered row are arranged in a Bayer array.

(16) The solid-state image pickup element according to any one of (9) to (13), in which a pixel group of an odd-numbered row formed on the light receiving surface of the solid-state image pickup element and a pixel group of an even-numbered row formed thereon are formed to be displaced by ½ pitch, each pixel of each pixel group has a color filter having the same color, one pixel group of an odd-numbered column or an even-numbered column has green color filters, and the other pixel group of the odd-numbered column or the even-numbered column has red color filters and blue color filters alternately in unit of group.

(17) An image pickup apparatus including: the solid-state image pickup element according to any one of (1) to (8); a photographing lens that performs focusing to a subject; and a control unit that performs a focus control of the photographing lens by measuring a distance to a subject from a detection signal of each pixel of the pixel group of the solid-state image pickup element.

(18) An image pickup apparatus including: the solid-state image pickup element according to any one of (9) to (16); and a signal processing unit that receives the captured image signal detected by each pixel of the pixel group to produce a three dimensional image.

(19) A solid-state image pickup element according to any one of (1) to (18), in which the solid-state image pickup element has configuration in which a back surface of the solid-state image pickup element is irradiated.

According to the embodiments described above, the groove is formed in a direction along an optical axis to fully reflect the incident light from the side face of the groove to obtain asymmetrical light information of light between the phase difference pixels without narrowing the opening of the light shielding film, so that it is possible to obtain the phase difference information without sacrificing the sensitivity.

INDUSTRIAL APPLICABILITY

The solid-state image pickup element according to the present invention can measure the distance to the subject, the image of the subject focused can be captured, so that the solid-state image pickup element is useful when it is applied to an image pickup apparatus such as, for example, a digital camera, a mobile phone equipped with a camera, and an electronic equipment equipped with a camera.

While the present invention has been described in detail or with reference to specific embodiments, it is apparent from those skilled in the art that various modifications or corrections can be made without departing from a spirit and scope of the present invention.

This application claims priority to and the benefits of Japanese Patent Application No. 2010-220074 filed on Sep. 29, 2010, the disclosure of which is incorporated herein by reference.

REFERENCE SIGNS LIST

20: photographing lens,
21: solid-state image pickup element
26: digital signal processing unit,
29: system control unit
40: semiconductor substrate,
41: color filter layer,
42; planarizing layer
43, 43a: microlens (optical element),
44: low refractive index layer (air, etc.)
45, 45a, 45b: intermediate low refractive index layer (optical element)
46, 47, 49, 61, 62: slit (groove),
48: metal plate

The invention claimed is:

1. A solid-state image pickup element comprising:
a pixel group configured by a plurality of pixels detecting a phase difference;
an optical element formed at an upper layer of a light-entering side of the pixel group; and
a groove formed in the optical element;
wherein the groove makes incident light entering into each of the plurality of pixels of the pixel group asymmetrical so as to cause a phase difference between the incident light entering into each of the plurality of pixels of the pixel group, and a side surface of the groove is a light reflecting surface.

2. The solid-state image pickup element according to claim 1, wherein the pixel group is configured by two adjacent pixels,
the optical element includes two microlenses each of which formed at an upper layer at a light entering side of the two adjacent pixels and corresponds to each of the two pixels, and
the groove separates the two microlenses from each other.

3. The solid-state image pickup element according to claim 2, further comprising:
an intermediate refractive-index layer formed at the upper layer at the light entering side of the microlens and having a refractive-index lower than that of the microlens, and
a low refractive-index layer formed at an upper layer at the light entering side of the intermediate refractive-index layer and having a refractive-index lower than that of the intermediate refractive-index layer,
wherein the groove is also formed at the intermediate refractive-index layer, and the same material as the low refractive-index layer is embedded in the groove.

4. The solid-state image pickup element according to claim 2, further comprising:
an intermediate refractive-index layer formed at the upper layer at the light entering side of the microlens and having a refractive-index lower than that of the microlens, and
a low refractive-index layer formed at an upper layer at the light entering side of the intermediate refractive-index layer and having a refractive-index lower than that of the intermediate refractive-index layer,
wherein the groove is filled with material having high light reflectivity.

5. The solid-state image pickup element according to claim 2, wherein the microlens on which the groove is formed becomes displaced toward a central direction of a light receiving surface as being closer from a center of the light receiving surface of the solid-state image pickup element to a periphery thereof.

6. The solid-state image pickup element according to claim 1, wherein the pixel group is configured by nearest four adjacent pixels,
the optical element includes four microlenses each of which formed at an upper layer at a light entering side of the four adjacent pixels and corresponds to each of the four pixels, and
the groove is formed at a cross shape when viewed from top to separate the four microlenses from each other.

7. The solid-state image pickup element according to claim 1, wherein the optical element is formed at the upper layer at a light entering side of the plurality of pixels of the pixel group, and
the groove is formed to surround an outer periphery of the optical element.

8. The solid-state image pickup element according to claim 7, further comprising a plurality of pixel groups,
wherein the plurality of pixel groups are successively installed at the entirety of the light receiving surface, and
the optical element is shared to cover the pixels of each pixel group and has the microlens corresponding to each pixel group,
the solid-state image pickup element further comprising:
an intermediate refractive-index layer formed at an upper layer at the light entering side of the microlens and made of material having a refractive-index lower than that of the microlens; and
a low refractive-index layer formed at an upper layer at the light entering side of the intermediate refractive-index layer and having a refractive-index lower than that of the intermediate refractive-index layer,
wherein the groove is also formed at the intermediate refractive-index layer, and the same material as the low refractive-index layer is embedded in the groove.

9. The solid-state image pickup element according to claim 8, wherein the surface of the intermediate refractive-index layer has a shape which is in conformity with the surface of the microlens.

10. The solid-state image pickup element according to claim 7, further comprising a plurality of pixel groups,
wherein the plurality of pixel groups are successively installed at the entirety of the light receiving surface, and the optical element is shared to cover the pixels of each pixel group and has the microlens corresponding to each pixel group, the solid-state image pickup element further comprising:

an intermediate refractive-index layer formed at an upper layer at the light entering side of the microlens and made of material having a refractive-index lower than that of the microlens; and a low refractive-index layer formed at the upper layer at the light entering side of the intermediate refractive-index layer and having a refractive-index lower than that of the intermediate refractive-index layer, wherein the groove is also formed at the intermediate refractive-index layer, and the groove is filled with material having high light reflectivity.

11. The solid-state image pickup element according to claim 1, further comprising a plurality of pixel groups, wherein the plurality of pixel groups are installed at discrete positions of the light receiving surface of the solid-state image pickup element.

12. The solid-state image pickup element according to claim 1, further comprising a plurality of pixel groups, wherein the plurality of pixel groups are successively installed at an entirety of the light receiving surface of the solid-state image pickup element.

13. The solid-state image pickup element according to claim 12, wherein the pixel group is arranged on the light receiving surface of the solid-state image pickup element in a square lattice, each pixel of each pixel group has a color filter having the same color, and a color filter arrangement of the pixel group is arranged in a Bayer array or stripe array.

14. The solid-state image pickup element according to claim 12, wherein a pixel group of an odd-numbered row formed on the light receiving surface of the solid-state image pickup element and a pixel group of an even-numbered row formed thereon are formed to be displaced by ½ pitch, each pixel of each pixel group has a color filter having the same color, color filters of the pixel group of odd-numbered row are arranged in a Bayer array, and color filters of the pixel group of even-numbered row are arranged in a Bayer array.

15. The solid-state image pickup element according to claim 12, wherein a pixel group of an odd-numbered row formed on the light receiving surface of the solid-state image pickup element and a pixel group of an even-numbered row formed thereon are formed to be displaced by ½ pitch, each pixel of each pixel group has a color filter having the same color, one pixel group of an odd-numbered column or an even-numbered column has green color filters, and the other pixel group of the odd-numbered column or the even-numbered column has red color filters and blue color filters alternately in unit of group.

16. An image pickup apparatus comprising:

the solid-state image pickup element according to claim 12; and a signal processing unit that receives the captured image signal detected by each pixel of the pixel group to produce a three dimensional image.

17. The solid-state image pickup element according to claim 1, wherein the optical element includes a single microlens which commonly covers the plurality of pixels of the pixel group.

18. An image pickup apparatus comprising:

the solid-state image pickup element according to claim 1;

a photographing lens that performs focusing to a subject; and a control unit that performs a focus control of the photographing lens by measuring a distance to a subject from a detection signal of each pixel of the pixel group of the solid-state image pickup element.

19. A solid-state image pickup element according to claim 1, wherein the solid-state image pickup element has configuration in which a back surface of the solid-state image pickup element is irradiated.

* * * * *